United States Patent [19]

Mehrgardt et al.

[11] Patent Number: 4,791,406
[45] Date of Patent: Dec. 13, 1988

[54] MONOLITHIC INTEGRATED DIGITAL-TO-ANALOG CONVERTER

[75] Inventors: Soenke Mehrgardt, March; Ulrich Theus, Gundelfingen, both of Fed. Rep. of Germany

[73] Assignee: Deutsche ITT Industries GmbH, Freiburg, Fed. Rep. of Germany

[21] Appl. No.: 74,205

[22] Filed: Jul. 16, 1987

[30] Foreign Application Priority Data

Jul. 21, 1986 [EP] European Pat. Off. ........ 86109971.1
Mar. 14, 1987 [EP] European Pat. Off. ........ 87103742.0

[51] Int. Cl.$^4$ .............................................. H03M 1/74
[52] U.S. Cl. .................................... 341/144; 323/317
[58] Field of Search ................. 323/317; 340/347 DA

[56] References Cited

U.S. PATENT DOCUMENTS

| 3,982,172 | 9/1976 | van de Plassche | 323/1 |
| 4,225,816 | 9/1980 | Schade | 323/4 |
| 4,703,310 | 10/1987 | van de Plassche | 340/347 DA |

FOREIGN PATENT DOCUMENTS 0170493 2/1986 European Pat. Off. .
2349874 11/1977 France .

OTHER PUBLICATIONS

"The Glitch-Free D/A Converter", *Digital Processes*, 5, 1979, pp. 133-140, by P. E. Danielsson.
"Dynamic Element Matching Puts Trimless Converters on Chip", *Electronics*, Jun. 16, 1983, pp. 130-134 by Rudy van de Plassche.
"Monolithic 14-Bit DAC with 85 dB S/N Ratio", *Electronics Components and Applications*, vol. 2, No. 4, Aug. 1980, pp. 235-241 by R. v.d. Plassche.

*Primary Examiner*—William M. Shoop, Jr.
*Attorney, Agent, or Firm*—T. L. Peterson

[57] ABSTRACT

A monolithic integrated digital-to-analog converter makes use of rotating current-source control (dynamic element matching). After the conversion of a digital input signal into a code containing a sequence of first binary conditions corresponding to the numerical value of the input signal (so-called thermometer code), the bit switches of possibly same-sized current sources are rotatingly controlled in the sense of being selected, so that it becomes possible in the manufacture of the monolithic integrated digital-to-analog converters to balance out the manufacturing tolerances or process variations of the current sources.

8 Claims, 3 Drawing Sheets

MONOLITHIC INTEGRATED DIGITAL-TO-ANALOG CONVERTER

BACKGROUND OF THE INVENTION

In the monolithic integration of high-accuracy current dividers with current sources for the large-scale production of monolithic integrated solid-state circuits there exists the difficulty of the process variations occurring in the manufacture of the current sources which, as is well known, can be realized in the form of collector-emitter sections of bipolar transistors of a so-called current bank, with the base electrodes being placed on a common potential. This difficulty, in the case of a monolithic integrated digital-to-analog converter (hereinafter briefly referred to as a "DAC") for a 14-bit dual number, with bipolar transistors, of the type as described in "Electronics" of June 16, 1983, pp. 130 to 134, and in "Electronic Components and Applications," Vol. 2, No. 4 (August 1980), pp. 235 to 241, has been overcome by using an integrated current divider, chiefly in that the currents of a plurality of current sources, with the aid of a shift register, are cyclically and rotatingly switched to three current paths of which the first and the second ones receive half the current of the third current. By cascading a plurality of such current dividers it is possible to obtain a highly accurate monolithic integrated DAC.

The present invention likewise makes use of this principle of dynamic "element matching" without, however, employing the above-mentioned current divider of the conventional DAC. Since that converter employs cascaded current dividers, one RC filter circuit with capacitors connected from the outside is required for each of the current dividers.

An object of the invention is to provide a monolithic integrable DAC which does not require any RC filter circuits and which, in particular, is capable of being manufactured in metal-oxide-semiconductor (MOS) technology without requiring a supply voltage substantially higher than 5 V. When the conventional arrangement is manufactured in MOS technology, and owing to the cascading of the dividers, there is required a supply voltage of more than 25 V.

SUMMARY OF THE INVENTION

The invention relates to a monolithic integrated DAC having a number of inputs which, under the control of a sampling signal, take over a multi-bit digital input signal at the clock rate of this sampling frequency. The digital input signal itself, with the aid of bit switches, applies to a summation point a number of current-source units corresponding to its value. In the course of this, at the frequency of a clock signal whose clock frequency amounts to a multiple of the sampling frequency, the current-source units are switched one at a time in turn within one sampling period, in such a way that all of the existing current-source units are turned on during this sampling period for exactly the same duration.

The invention starts out from the idea of having a number of possibly identical current sources, one at a time in turn and by means of a shift-register network which is clocked at the clock frequency fc, rendered conductive in such a way that, on the average, the tolerances of these current sources annul each other.

Accordingly, the multi-bit input signal whose code might be arbitrary but, as a rule, will mostly be a dual-number code, is converted with the aid of a suitable code converter into a likewise suitable binary output code by which, via bit switches, there is rendered conductive such a number of current sources as corresponds to the numerical value of the input signal. Preferably, one such code is a glitch-free code such as the thermometer code. In the case of a more general code the number of first binary conditions at which the bit switches are turned on is equal to the number of first binary conditions in the corresponding thermometer code; their arrangement within the code word, however, and in contradistinction to the thermometer code, is arbitrary.

BRIEF DESCRIPTION OF THE DRAWINGS

In the following, the invention will now be explained in greater detail with reference to FIGS. 1 to 5 of the accompanying drawings, in which.

DETAILED DESCRIPTION OF THE PREFERRED EMBODIMENTS

Figure 1:
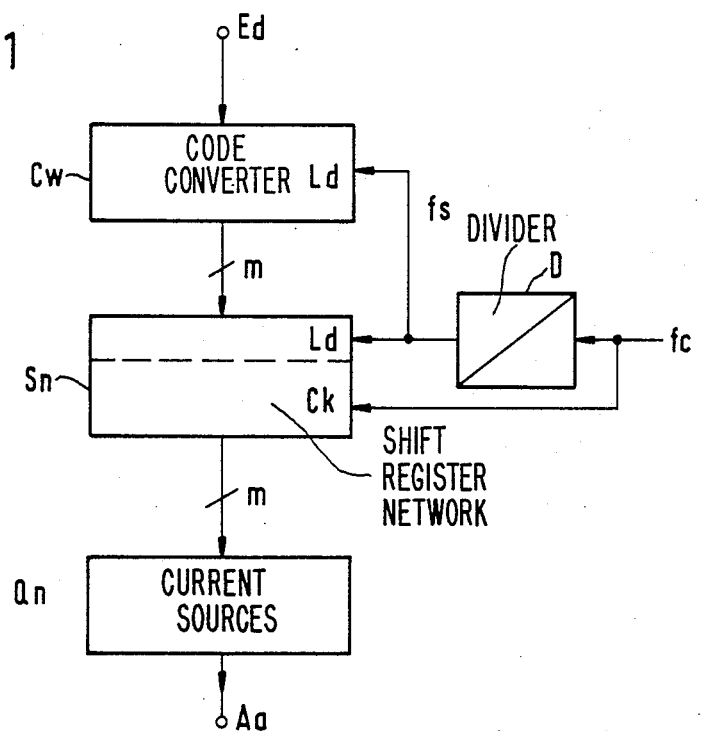
FIG. 1 shows the basic circuit diagram of one example of embodiment of the digital-to-analog converter (DAC) according to the invention.

According to the basic circuit diagram of the example of embodiment as shown in FIG. 1, the input signal Ed is applied to the input of the code converter C2 which is gated at the sampling frequency fs at the charge input Ld, and converts the input signal Ed into a signal in the so-called thermometer code. Accordingly, at the output of the code converter Cw there results in parallel form a sequence of first, i.e. current turn-on, binary conditions, with the number thereof being equal to the numerical value of the input signal Ed. If, in the course of this, the maximum applicable numerical value of the input signal Ed, independently of the input code, is "m," then "m" also represents the number of parallel output lines of the code converter Cw, and "m" also represents the maximum number of controllable current-source units of th current-source part Qn. Via the cyclical shift-register network Sn the thermometer code is applied to the current-source units of the current-source part Qn, thus causing the control electrodes of the bit switches of the current-source units to be rendered conductive rotatingly. The analog signal is obtained at the output Aa of the current-source part Qn after the currents of the current-source units have been summed up. From the clock signal at the clock frequency fc which effects the clocking of the cyclical shift-register network Sn, the divider D produces the sampling signal at the sampling frequency fs, by which the m inputs of the cyclical shift-register Sn are rendered conductive. The number of divisions is still determined exactly later on, but is in the order of m.

As the cyclical shift-register network Sn there is used, for example, a barrel shifter (cf. EP-A No. 0 170 493) according to the known prior art.

In the barrel shifter, by way of electrical switching elements, the connection of a number of input terminals to an equally large number of output terminals is switched over cyclically, in the course of which the plurality of the internal switching connections is changed equidirectionally in parallel by respectively one position only. The output terminal appearing to be left over on the one side of the barrel shifter is then connected to the output terminal as becoming free on the other side, and thus effects the cyclical switching. The input of the individual shift positions is mostly carried out in a binary-encoded manner, so that instead of the control being effected via a divider, it is more likely to prefer a counter with encoded output signals.

Without the cyclical shift-register network, hence in the case of a purely static control, the advantage of rotatingly switching the m current-source units would be sacrificed, thus causing the linearity of the DAC to be determined alone by the relative equality of the m current-source units as is the case with a conventional type of DAC.

In the case of a monolithic integration without any balancing, however, there will have to be reckoned with typical tolerances of one per cent (1%) for the individual current-source units, so that a linearity requirement of e.g. 0.01 percent cannot be met without involving any special investment. On principle it is possible, by rotatingly switching the current-source units at the clock frequency fc which is higher than the sampling frequency fs, to bring the linearity error down to zero.

Figure 2:
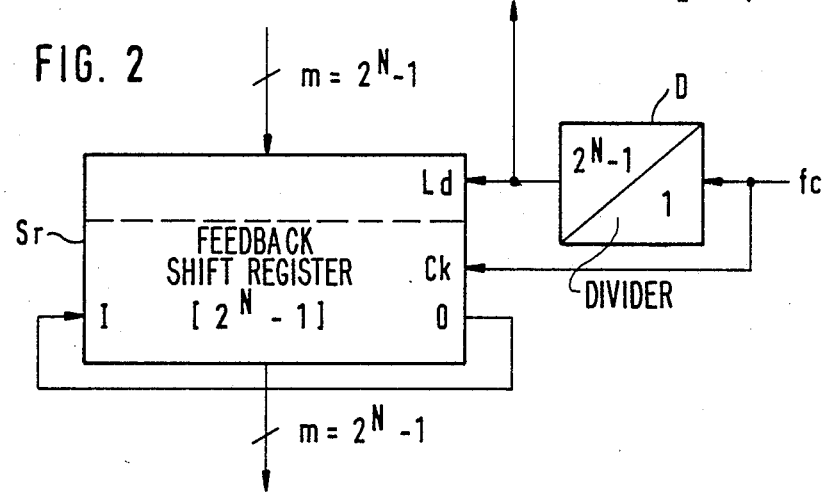
FIG. 2 shows one preferred embodiment of the cyclical current switching.

Relative thereto it is of particular interest with respect to the compensation for tolerances when the relationship between the clock frequency fc and the sampling frequency fs is either the same or else an integer multiple of the number of steps of the shift-register network Sn, and consequently also of the number of current-source units capable of being turned-on successively. In that case, in the sampling-frequency interval, all of the current-source units are exactly actuated equally often, and the linearity error which is due to the tolerances of the current-source units, is completely eliminated within one sampling cycle. In this particular case the cyclical shift-register network Sn can be realized by using a feed-back type of shift register Sr. In FIG. 2 this is illustrated with regard to an N-bit dual number applied to serve as the input signal Ed.

The feed-back type of the shift register Sr as shown in FIG. 2 is composed of $m=2^N-1$ individual shift-register stages comprising $m=2^N-1$ parallel input terminals and the same number of parallel output terminals, with the latter having to be connected to the corresponding bit-switching terminals of the current-source part. Following one complete cycle, hence after $m=2^N-1$ shifting clocks, a new thermometer code word is written with the aid of the sampling signal at the charge input Ld, into the fed back shift register Sr. Here, the sampling signal at the sampling frequency fs, is realized by the output signal of the divider D, whose input signal is the clock signal and whose number of division is $2^N-1$. The output O of the last shift-register stage is connected to the input I of the first shift-register stage, and thus forms the feedback of the shift register Sr.

Figure 3:
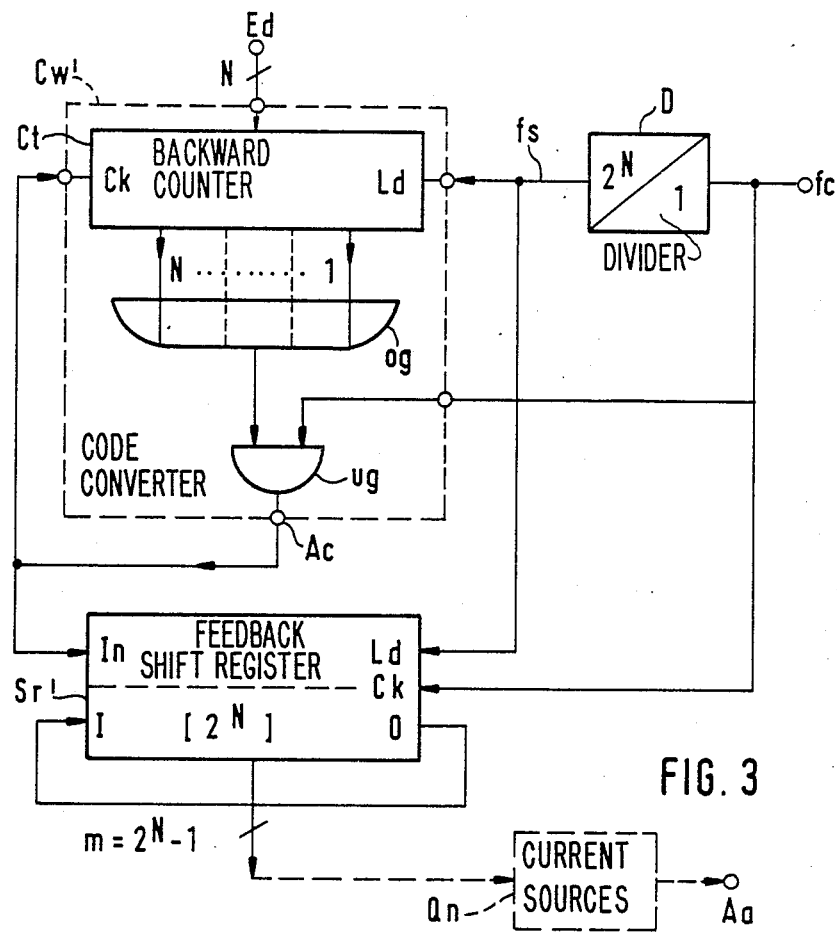
FIGS. 3 and 4 show the block diagrams of code converters for converting a dual-numbered input signal into the thermometer code.

It is of particular advantage in this case when the frequency-response ratio of the clock frequency fc to the sampling frequency fs is raised to the complete second power, such as $fc/fs=2^N$, because then the divider D can be realized by using a simple type of binary counter, hence in the given example, an N-bit divider composed of N binary dividing stages (see, for example, FIG. 3). Relative thereto, the fed-back shifter register Sr' contains $2^N$ stages, but only $2^N-1$ bit-switch outputs. Accordingly, one of the shift-register stages alone serves the clock-adaptation purpose, without controlling one of the bit switches. The output O of the last shift-register stage, similar as in FIG. 2, is connected to the input I of the first shift-register stage in order thus to illustrate the feedback of the shift register Sr'.

The production of a suitable code from a dual N-bit input signal Ed is simple for the fed-back shift register Sr, because the order of sequence of the binary conditions may be arbitrary as long as the number of the current turn-on binary conditions equals the fed-in numerical value. For example, to each input point there is assigned an equal number of output points corresponding to its respective valency and which, quite depending on the binary condition of this paritcular input point, jointly show to have either the one or the other binary condition. This is effected, for example, by one non-inverting impedance transformer per input point, whose output is $2^k$-times branched, with $0 \leq k \leq N$ being given by the respective point having the valency $2^k$ within the dual input signal Ed.

FIG. 3 shows the block diagram of a code converter Cw' which makes it possible to produce the thermometer code from an N-bit dual number supplied as the input signal Ed, without requiring an expensive logical network. This code converter Cw' contains the presettable backward counter Ct which, by means of the sampling pulse at the charge input Ld, takes over the input signal Ed into the counter reading (status). Moreover, the code converter contains the AND gate ug as well as the OR gate og. During operation of both gates in a positive logic there is then applied to the output of e.g., the AND gate ug the positive level H (=H level) of two binary levels H, L when H levels are likewise applied to all inputs of the AND gate ug.

The counting pulses appearing at the clock input Ck of the backward counter Ct are the pulses of the clock signal which are led via the AND gate ug as the gating circuit, causing the backward counter Ct to count at the clock-frequency rate fc in the backward direction so long until there is reached the counter reading (status) zero. This zero condition is recognized by the OR gate og, because in this particular case all of the N inputs of the OR gate og which are connected to the N counter-reading outputs, are respectively applied to the logic L level, so that the output signal of the OR gate og changes from the previous H level to the new L level, thus blocking the AND gate ug against the clock signal.

The output of the AND gate ug is at the same time also the output Ac of the code converter Cw' and, moreover, is connected to the serial input In of the fed-back shift register Sr'. The pulse sequence from the code converter output Ac as filed or stored therein within one sampling cycle corresponds to the thermometer code of the input signal Ed.

In the case of N=4 and, for example, a dual number reading 1111, therefore, so many pulses are fed via the serial input In into the shift register Sr', until all of 15 storage or memory positions which control the bit switches, are on the H level; after that, this input procedure is terminated. In response to the next arriving pulse of the sampling signal at the charge input Ld, the backward counter Ct is recharged with the input signal Ed. At the same time, from the serial input part of the fed-back shift register Sr', the data contents are taken over into the actual shift-register part. This takeover control is likewise effected by the sampling signal fs as applied to the charge input Ld of the shift register Sr'.

Figure 4:
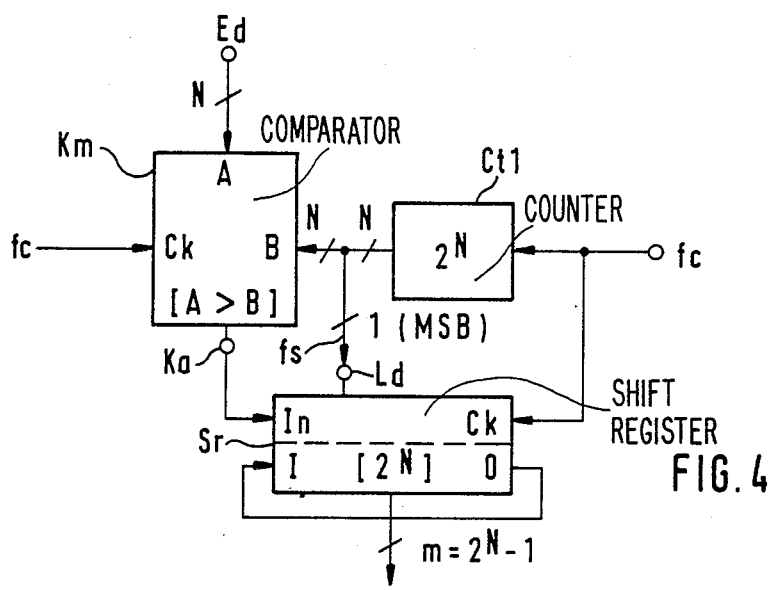

FIG. 4 shows the block diagram of a different type of code converter for producing the thermometer code. This code converter differs from the code converter Cw' as shown in FIG. 3 in that it, instead of the dual N-bit backward counter Ct, contains the digital comparator Km comprising an N-bit subtrahend input B and an N-bit minuend input A, with the dual N-bit input signal Ed being fed to the latter. Instead of the N-bit binary divider D as shown in FIG. 3, there is used the N-bit binary counter Ct1 whose N counter-reading outputs are connected to the associated N points of the subtrahend input B of the digital comparator Km. Accordingly, the comparator Km replaces the dual N-bit backward counter Ct as shown in FIG. 3 and, via its output terminal Ka, permits the serial reading of pulses at the clock frequency fc into the $2^N$-stage shift register Sr as long as the numerical value applied to the minuend input A exceeds or is greater than the numerical value as applied to the subtrahend input B. Relative thereto, the sampling signal at the sampling frequency fs represents the MSB (=most significant bit) signal of the dual N-bit counter Ct1.

Figure 5:
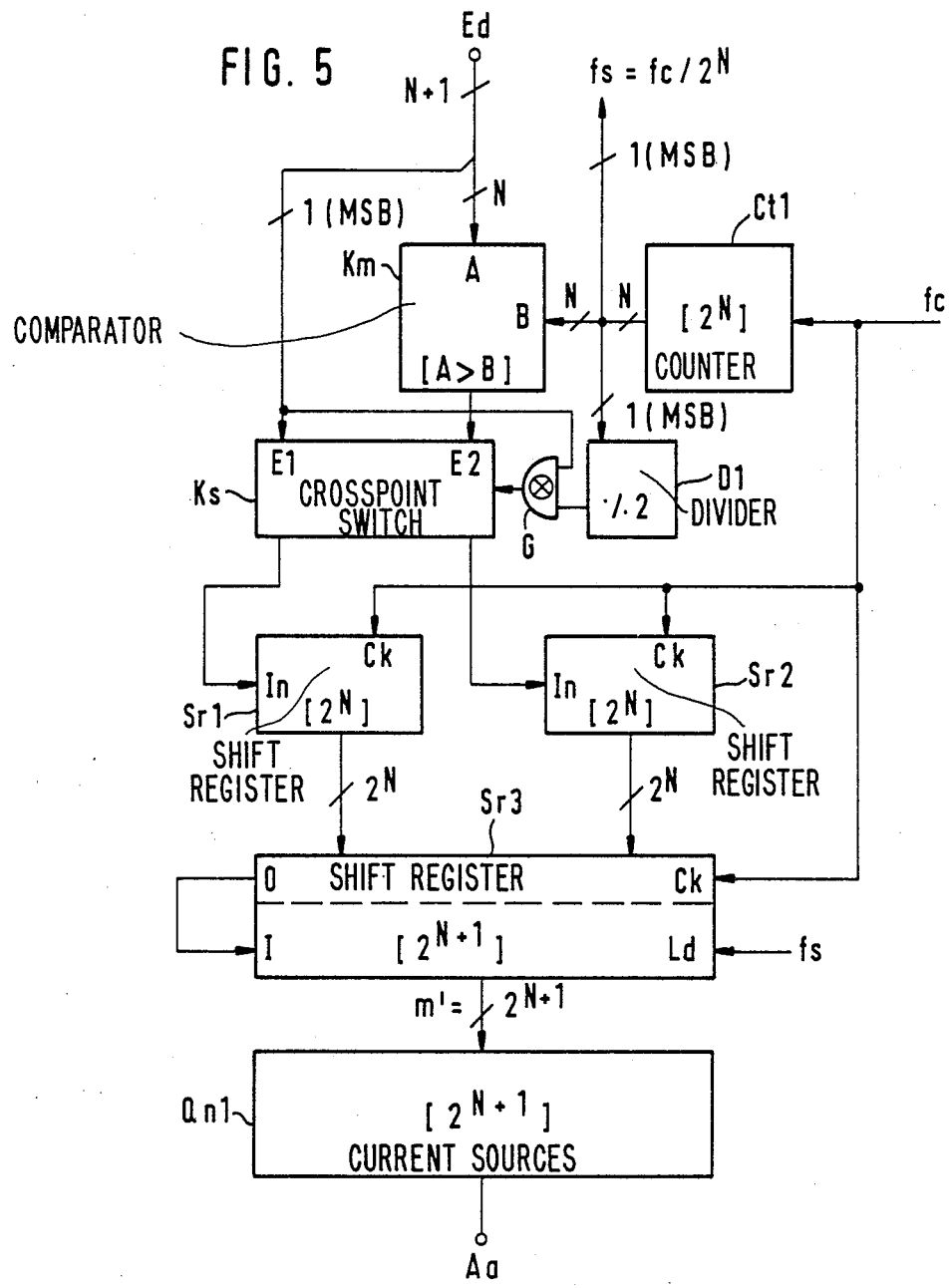
FIG. 5 shows the block diagram of a DAC for a dual number with N+1 bits.

Finally, FIG. 5 shows a DAC including a further embodiment of the circuit arrangement as shown in FIG. 4. This DAC of FIG. 5, with respect to a dual (N+1)-bit input signal, and by employing the code converter of FIG. 4, as well as the crosspoint switch Ks, the first and the second $2^N$-stage shift registers Sr1, Sr2, and the third $2^{N+1}$-stage shift register Sr3 which is fed back in itself, provides at its output Aa a ditital-to-analog converted signal in a resolution which is double as large (6 db) as that of a DAC employing code converters of the type as shown in FIG. 3 or FIG. 4.

The gain in resolution and, consequently, the improvement of the signal-to-noise ratio is accomplished in that the bit number of the dual input signal Ed is raised by one bit compared to the one shown in FIG. 3 or FIG. 4. This becomes significant owing to the fact that the factor of the clock frequency to the sampling frequency fc/fs=m as an integer proportionally (proportional control) factor, contains at least the maximum possible numerical value m of the input signal Ed and, accordingly, in the case of a fixed sampling frequency fs, is capable of raising the clock frequency fc with an increased resolution. With regard to the clock frequency, however, there are certain limits from a circuit-technical point of view.

The example of embodiment according to FIG. 5 permits an extension to dual (N+1)-bit input signals although with the N bits according to FIG. 3 or FIG. 4 there is actually reached the maximum admissible clock frequency fc. In so doing, the fed-back shifter register is divided for the writing-in process into two equal sections which, however, are read-in simultaneously. Into the first section, in accordance with the respective MSB position of the input signal Ed, there are written all of the H or L levels, whereas into the second section according to FIG. 4 there is read that particular dual number in the form of the thermometer code which remains to be left over after the MSB point has been stripped off the dual input signal Ed.

During one single sampling cycle the fed-back shift register only performs one half of a rotation, which means to imply that the contents of the two sections have been exchanged for one another. Thus, in the course of the next or new writing-in process which, as is well-known, is coupled to the sampling frequency fs, either the H or the L levels corresponding to the respective MSB position, must be written into the second section. Into the first section there is then written the thermometer code of the input signal ED as stripped off the MSB position. In the case of a constant input signal Ed there is thus effected, after one complete rotation or two sampling cycles, the entire compensation for tolerances of the current-source units within the current-source part Qn1. In the case of changing or varying input signals Ed this compensation is no longer entire or complete, but the resulting noise signal is far above or beyond the input-signal frequency and is thus easily capable of being filtered out.

The writing-in process in the case of the two shift-register sections is controlled with the aid of a crosspoint switch whose switch position is changed or switched over in response to every sampling pulse. One simple example relating to the crosspoint switching is shown in FIG. 5 in which the crosspoint switch Ks is shown to switch over each time only two signal paths for pulses written in serial form into the first or the second $2^N$-stage shift register Sr1, Sr2 serving as a buffer store or temporary memory. From there they are fed in parallel into the two sections of the third fed-back $2^{N+1}$-stage shift register Sr3. The takeover into this section is effected by the sampling signal fs at the charge input Ld. Owing to this sectional charging process the third shift register Sr3 has $2^{N+1}$ inputs and also the same number of bit-switch outputs m', although in the current-source part Qn1 only a maximum number of $2^{N+1}-1$ current-source units according to the largest possible number $m=2^{N+1}-1$ of the input signal Ed is being switched simultaneously.

Owing to the crosspoint switching, an MSB jump of the input signal Ed may easily cause a more or less one-sided occupation of the third shift register Sr3. This error is avoided by the use of the XOR gate G as shown in FIG. 5, because the respective position of the crosspoint switch Ks not only depends on the divided-down sampling signal fs, but also on the MSB position of the input signal Ed. Accordingly, in the case of signals lying around the MSB value, the two sections of the third shift register Sr3 are included more uniformly and, consequently, more advantageously in the current-source rotation.

The functional operation of the crosspoint switch Ks as shown in FIG. 5 may be explained somewhat as follows. While the MSB signal of the input signal Ed is applied to the first input E1 of the crosspoint switch Ks, the second input E2 thereof, as in the arrangement according to FIG. 4, receives pulses as long as the input signal Ed, reduced by the MSB, is at the minuend input A larger than the input signal at the subtrahend input B. The last-mentioned N-bit signal is formed by the N-bit counter Ct1 from the clock signal at the clock frequency fc, with the MSB being used as the sampling signal at the sampling frequency fs and for obtaining the switching cycle of the crosspoint switch Ks with the aid of the first divider D1. The latter serves to divide the MSB clock frequency by the factor 2.

The configuration and design of the dividers, of the counters, of the shift registers and of the comparator can be carried out in the manner well known to those skilled in the art. A particular advantage of the digital-to-analog converter (DAC) according to the invention is achievable when employing insulated-gate field-effect transistors in the design, because a cascading according to the aforementioned state of the art is avoided, so that it will be possible to use a supply voltage of merely 5 to 6 V. Another advantage is seen in that the filter capacitors required according to the prior art for forming part of the cascade circuit, may be omitted.

The invention, for example, is used as a partial circuit in a high-resolution type audio D/A converter, and thus permits to achieve a resolution corresponding to a 16-position dual number (16 bit).

What is claimed is:

1. A monolithic integrated digital-to-analog converter comprising:

a code converter having an input to which a multi-bit digital input signal is provided, said code converter providing a coded output signal for each of a plurality of sample periods determined by a sampling signal, said coded output signal comprising a plurality of binary outputs, a first number of said outputs having a first binary condition and a second number of said outputs having a second binary condition, said first number equal to the numeric value of said digital input signal;

a first shift register having a plurality of inputs connected to said code converter, said first shift register being loaded with said coded output signal from said code converter at a rate controlled by said sampling signal, the contents of said first shift register being shifted at a rate controlled by a clock signal having a frequency which is a multiple of the frequency of said sampling signal, said shift register providing a plurality of binary output signals on a corresponding plurality of output lines, said binary output signals of said shift register having binary levels determined by said coded output signal from said code converter and changing as said shift register is shifted; and a plurality of current sources connected to said output lines of first shift register, said current sources being selectively activated in accordance with said binary levels of said output lines of said first shift register, each of said current sources being turned on for the same time duration in each of said sample periods, the number of said current sources turned on at any one time determined by said first number, said current sources being coupled to a summation stage whose output is the output of said digital-to-analog converter.

2. A monolithic integrated digital-to-analog converter comprising:

a code converter having an input to which a multi-bit digital input signal is provided, said code converter providing a coded signal for each of a plurality of sample periods determined by a sampling signal, said coded signal having a continuous number of binary conditions that is equal to the numeric value of said digital input signal, said converter additionally comprising a divider that produces said sampling signal from said clock signal by frequency division;

a first shift register connected to said code converter, said first shift register being loaded with the output of said code converter at a rate controlled by said sampling signal, the contents of said first shift register being shifted at a rate controlled by a clock signal having a frequency which is a multiple of the frequency of said sampling signal, said first shift register comprising a feedback shift register, said feedback shift register having a number of shifting stages equal to the ratio of the frequency of said clock signal to the frequency of said sampling signal; and a plurality of current sources connected to said first shift register, said current sources being selectively activated by the output of said first shift register, each of said current sources being turned on for the same time duration in each of said sample periods, said current sources being coupled to a summation stage whose output is the output of said digital-to-analog converter.

3. A monolithic integrated digital-to-analog converter as defined in claim 2, wherein:

the ratio of the frequency of said clock signal to the frequency of sampling signal is $2^N$;

said divider is a binary divider comprising N dividing stages; and said feedback shift register comprises $2^N$ shifting stages.

4. A monolithic integrated digital-to-analog converter as defined in claim 3, wherein:

said input signal is a dual N-bit input signal;

said code converter comprises a dual N-bit backward counter which is set to the numeric value of said input signal; and said code converter supplies a pulse train of clocked pulses to a serial input of said feedback shift register until said backward counter reaches zero.

5. A monolithic integrated digital-to-analog converter as defined in claim 3, wherein:

said code converter comprises a comparator clocked at the frequency of said clock signal, said comparator including an N-bit subtrahend input and an N-bit minuend input to which said input signal is supplied;

said divider comprises an N-bit counter which is clocked at the frequency of said clock signal and which has a counter output that supplies the subtrahend input of said comparator, the output of said comparator transmitting pulses at the frequency of said clock signal to a serial input of said feedback shift register as long as the numeric value of the output of said counter is applied to the subtrahend input of said comparator; and the most significant bit of the output of said counter serves as said sampling signal.

6. A monolithic integrated digital-to-analog converter comprising:

a code converter having an input to which an digital input signal, having N+1 bits, is provided, said code converter providing a coded signal for each of a plurality of sample periods determined by a sampling signal, said coded signal having a continuous number of binary conditions equal to the numeric value of said digital input signal;

a first shift register connected to said code converter, said first shift register being loaded with the output of said code converter at a rate controlled by said sampling signal, the contents of said first shift register being shifted at a rate controlled by a clock signal having a frequency which is a multiple of the frequency of said sampling signal, wherein:

said first shift register is a feedback shift register comprising $2^{N+1}$ shifting stages having an equal number of inputs and outputs, the loading of said feedback shift register being controlled by said sampling signal; and said feedback shift register is loaded alternatingly such that during one sampling cycle a first half of said feedback shift register is loaded with binary signals equal to the most significant bit of said input and a second half of said feedback shift register is loaded with the thermometer code of all bits of said input signal except the most significant bit and during the other sampling cycle the contents of said first and second halves of said feedback shift register are exchanged, unless a jump of the most significant bit of said input signal is present; and a plurality of current sources connected to said shift register, said current sources being selectively activated by the output of said shift register, each of said current sources being turned on for the same duration in each of said sample periods, said current sources being coupled to a summation stage whose output is the output of said digital-to-analog converter.

7. A monolithic integrated digita-to-analog converter as defined in claim 6, additionally comprising a crosspoint switch that causes said first and said second halves of said feedback shift register to be alternatingly loaded.

8. A monolithic integrated digital-to-analog converter as defined in claim 7, wherein:

said code converter comprises a comparator clocked at the frequency of said clock signal, said comparator including an N-bit subtrahend input and an N-bit minuend input to which said input signal is supplied; and wherein said crosspoint switch has a first input that is supplied with the most significant bit signal of said input signal and a second input that is supplied with the output of said comparator, said crosspoint switch having a first output that is connected to the serial input of a second shift register and a second output that is connected to the serial input of a third shift register, said second shift register having $2^N$ outputs which are supplied to the first half of said first shift register, and said third shift register having $2^N$ outputs which are supplied to the second half of said first shift register.

* * * * *